United States Patent
Choi

[19]

[11] Patent Number: 6,160,731
[45] Date of Patent: Dec. 12, 2000

[54] MEMORY DEVICE WITH SKEW-REMOVABLE I/O STRUCTURE

[75] Inventor: Jae Myoung Choi, Kyoungki-do, Rep. of Korea

[73] Assignee: Hyundai Electronics Industries Co., Ltd., Kyoungki-do, Rep. of Korea

[21] Appl. No.: 09/340,800

[22] Filed: Jun. 28, 1999

[30] Foreign Application Priority Data

Jun. 29, 1998 [KR] Rep. of Korea ................ 98-24911

[51] Int. Cl.[7] .................................................. G11C 5/06
[52] U.S. Cl. ........................ 365/63; 365/230.03; 365/51
[58] Field of Search ...................... 365/230.01, 189.01, 365/230.03, 230.06, 63, 51

[56] References Cited

U.S. PATENT DOCUMENTS

| | | | |
|---|---|---|---|
| 5,103,282 | 4/1992 | Isomura et al. | 357/45 |
| 5,227,324 | 7/1993 | Fujimoto et al. | 437/51 |
| 5,243,208 | 9/1993 | Isomura et al. | 257/211 |
| 5,299,160 | 3/1994 | Mori | 365/200 |
| 5,309,371 | 5/1994 | Shikata et al. | 364/491 |
| 5,838,627 | 11/1998 | Tomishima et al. | 365/230.03 |
| 5,943,285 | 8/1999 | Kohno | 365/230.03 |

*Primary Examiner*—Viet Q. Nguyen
*Attorney, Agent, or Firm*—Ladas & Parry

[57] ABSTRACT

A memory device having a plurality of input/output (I/O) pads, comprising: a cell array which is divided into a plurality of cell regions; a data pad having the plurality of I/O pads, the pads being grouped into a plurality of pad groups in accordance with the cell regions; and an internal data line being divided into a plurality of line groups in accordance with the pad groups, each of line groups having a plurality of data lines being connected only to the I/O pads of corresponding one of pad groups.

17 Claims, 4 Drawing Sheets

MEMORY DEVICE WITH SKEW-REMOVABLE I/O STRUCTURE

BACKGROUND OF THE INVENTION

This invention relates to a memory device with skew-removed I/O structure, and more particularly to a memory device having multiple I/O pads, which is applicable to all sorts of memory devices and logic devices using a I/O pads of odd number such as devices having a parity bit.

FIG. 1 shows a connection scheme between an internal data line and I/O pads in a conventional memory device 10 having I/O pads of odd number, for example, 9 I/O pads I/O0–I/O8. An internal data line should be connected to all I/O pads I/O0–I/O8 so that internal data lines 12 of nine times as much as I/O pad number are required in case where the memory device 10 has nine I/O pads. Data buffers DB10 to DB18 are respective connected to the respective I/O pads I/O10–I/O18 so as to transfer data between the I/O pad and a memory cell array 11.

The connection scheme of FIG. 1 has disadvantage as follows. As a number of the internal data lines are increased, the dimension that the internal data lines are occupied in a memory device is continually increased so that the dimension of the memory device 10 becomes seriously increased. Because the internal data lines 12 should be connected to all I/O pads, the internal data lines 12 are long in length so that data processing performance becomes degraded. That is, there is very large skew between the central I/O pads, for example I/O3 to I/O5 and the peripheral I/O pads, for example I/O0 and I/O9 due to line delay of the internal data line 12.

SUMMARY OF THE INVENTION

It is an object of the present invention to provide a memory device to reduce skew due to delay of a data line.

According to an aspect of the present invention, there is provided to a memory device having a plurality of I/O pads, comprising: a cell array which is divided into a plurality of cell regions; a data pad having the plurality of I/O pads, the pads being grouped into a plurality of pad groups in accordance with the cell regions; and an internal data line being divided into a plurality of line groups in accordance with the pad groups, each of line groups having a plurality of data lines being connected only to the I/O pads of corresponding one of pad groups.

According to the present invention, when the data pad has I/O pads of odd number, the data pad is grouped into a plurality of pad groups centering around a central I/O pad and the internal data line is divided into a plurality of line groups centering around the central I/O pad and each of line groups is connected to corresponding one of line groups and the central I/O pad is connected to all line groups.

According to the present invention, when the data pad is grouped into a first pad group and a second pad group centering around the central I/O pad and the internal data line is divided into a first line group and a second line group centering around the central I/O pad, the cell array is divided into a first cell region and a second cell region and data from the first cell region are transferred into the I/O pads of the first pad group and the central I/O pad through the first line group of the internal data line and data from the second cell region are transferred into the I/O pads of the second pad group and the central I/O pad thorough the second line group of the internal data line.

The first line group of the internal data line includes a plurality of first main data lines for transferring the data from the first cell region into the I/O pads of the first pad group; and a plurality of first sub data lines for transferring the data from the first cell region into the central I/O pad.

The second line group of the internal data line includes a plurality of second main data lines for transferring data from the second cell region into the I/O pads of the second pad group; and a plurality of second sub data lines for transferring the data from the second cell region into the central I/O pad.

The memory device of the present invention further comprises a data selection circuit for selecting corresponding one of the data from the data lines and transferring a selected one to one I/O pad of the I/O pads, in accordance with a selection signal and an enable signal.

The data selection circuit includes a plurality of first data selection means for selecting one of the data transferred from the first cell region through the plurality of first main data lines of the first line group and transferring a selected one into corresponding I/O pad of the first pad group; a plurality of second data selection means for selecting one of the data transferred from the second cell region through the plurality of second main data lines of the second line group and transferring a selected one into corresponding I/O pad of the second pad group; and a plurality of third data selection means for selecting one of the data transferred from the first cell region through the plurality of first main data lines of the first line group or the data transferred from the second cell region through the plurality of second main data lines of the second line group and transferring a selected one into the central I/O pad.

According to the present invention, each of the plurality of first data selection means includes a transfer means for transferring the selected data from the first cell region into corresponding I/O pad of the first pad group through the first main data line; and a signal generation means for generating a pair of control signals for controlling the transfer means in accordance with the selection signal for selecting corresponding one of the data from the first cell region and the enable signal for enabling the corresponding main data line of the plurality of first main data lines. The transfer means in each first data selection means includes a transmission gate driven by the pair of control signals generated from the signal generation means of each first data selection means. The signal generation means in each first data selection means includes a NAND gate receiving the selection signal and the enable signal; a first inverting gate for inverting an output of the NAND gate to generate a first control signal of the control signal pair to the transfer means of each first data selection means; and a second inverting gate for inverting an output of the first inverting gate to generate a second control signal of the control signal pair to the transfer means of each first data selection means.

According to the present invention, each of the plurality of second data selection means includes a transfer means for transferring the selected data from the second cell region into corresponding I/O pad of the second pad group through the second main data line; and a signal generation means for generating a pair of control signals for controlling the transfer means in accordance with the selection signal for selecting corresponding one of the data from the second cell region and the enable signal for enabling the corresponding main data line of the plurality of second main data lines. The transfer means in each second data selection means includes a transmission gate driven by the pair of control signals generated from the signal generation means of each second data selection means. The signal generation means in each second data selection means includes: a NAND gate receiving the selection signal and the enable signal; a first inverting gate for inverting an output of the NAND gate to generate a first control signal of the control signal pair to the transfer means of each second data selection means; and a second inverting gate for inverting an output of the first inverting gate to generate a second control signal of the control signal pair to the transfer means of each second data selection means.

According to the present invention, each of the plurality of third data selection means includes a transfer means for transferring the selected data of the data from the first cell region or the data from the second cell region into the central I/O pad through corresponding one of the first sub data line or the second sub data line; and a signal generation means for generating a pair of control signals for controlling the transfer means in accordance with the selection signal for selecting corresponding one of the data from the first cell region or the data from the second cell region and the enable signal for enabling the corresponding sub data line of the first sub data line or the second sub data line. The transfer means includes a transmission gate driven by the pair of control signals generated from the signal generation means. The signal generation means in each third data selection means includes a NAND gate receiving the selection signal and the enable signal; a first inverting gate for inverting an output of the NAND gate to generate a first control signal of the control signal pair to the transfer means of each third data selection means; and a second inverting gate for inverting an output of the first inverting gate to generate a second control signal of the control signal pair to the transfer means of each third data selection means.

There is also provided to a memory device having a plurality of input/output (I/O) pads, comprising: a cell array which is divided into a plurality of cell regions; a data pad having the plurality of I/O pads, the pads being grouped into a plurality of pad groups in accordance with the cell regions; an internal data line being divided into a plurality of line groups in accordance with the pad groups, each of line groups having a plurality of data lines being connected only to the I/O pads of corresponding one of pad groups; and a data selection circuit for selecting corresponding one of the data from the data lines and transferring a selected one to one I/O pad of the I/O pads, in accordance with a selection signal for selecting corresponding data from the cell regions and an enable signal for enabling corresponding one of the data lines.

There is also provided to a memory device having input/output (I/O) pads of odd number, comprising: a cell array which is divided into a plurality of cell regions; a data pad having the plurality of I/O pads, the pads being grouped into a plurality of pad groups in accordance with the cell regions; an internal data line being divided into a plurality of line groups in accordance with the pad groups, each of line groups having a plurality of data lines being connected only to the I/O pads of corresponding one of pad groups; and a data selection circuit for selecting corresponding one of the data from the data lines and transferring a selected one to one I/O pad of the I/O pads, in accordance with a selection signal for selecting corresponding data from the cell regions and an enable signal for enabling corresponding one of the data lines;

wherein data pad is grouped into a first pad group and a second pad group centering around the central I/O pad and the internal data line is divided into a first line group and a second line group centering around the central I/O pad and the cell array is divided into a first cell region and a second cell region so that data from the first cell region are transferred into the I/O pads of the first pad group and the central I/O pad through the first line group of the internal data line and data from the second cell region are transferred into the I/O pads of the second pad group and the central I/O pad through the second line group of the internal data line;

wherein the first line group of the internal data line includes a plurality of first main data lines for transferring the data from the first cell region into the I/O pads of the first pad group; and a plurality of first sub data lines for transferring the data from the first cell region into the central I/O pad;

wherein the second line group of the internal data line includes a plurality of second main data lines for transferring data from the second cell region into the I/O pads of the second pad group; and a plurality of second sub data lines for transferring the data from the second cell region into the central I/O pad; and wherein the data selection circuit includes a plurality of first data selection means for selecting one of the data transferred from the first cell region through the plurality of first main data lines of the first line group and transferring a selected one into corresponding I/O pad of the first pad group; a plurality of second data selection means for selecting one of the data transferred from the second cell region through the plurality of second main data lines of the second line group and transferring a selected one into corresponding I/O pad of the second pad group; and a plurality of third data selection means for selecting one of the data transferred from the first cell region through the plurality of first main data lines of the first line group or the data transferred from the second cell region through the plurality of second main data lines of the second line group and transferring a selected one into the central I/O pad.

BRIEF DESCRIPTION OF THE DRAWINGS

The objects and features of the invention may be understood with reference to the following detailed description of an illustrative embodiment of the invention, taken together with the accompanying drawings in which.

DETAILED DESCRIPTION OF THE INVENTION

Figure 1:
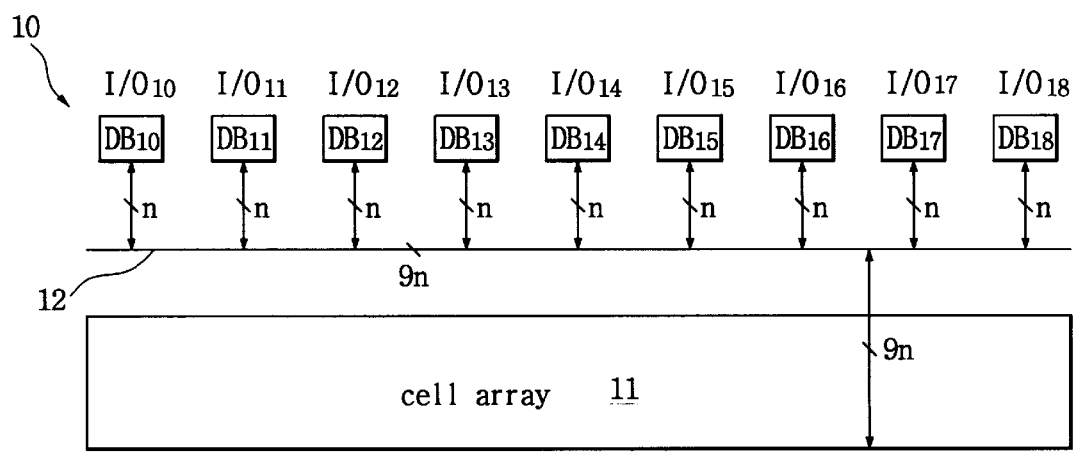
FIG. 1 is a diagram showing a connection scheme between internal data lines and I/O pads in a conventional memory device having I/O pads of odd number.
Figure 2:
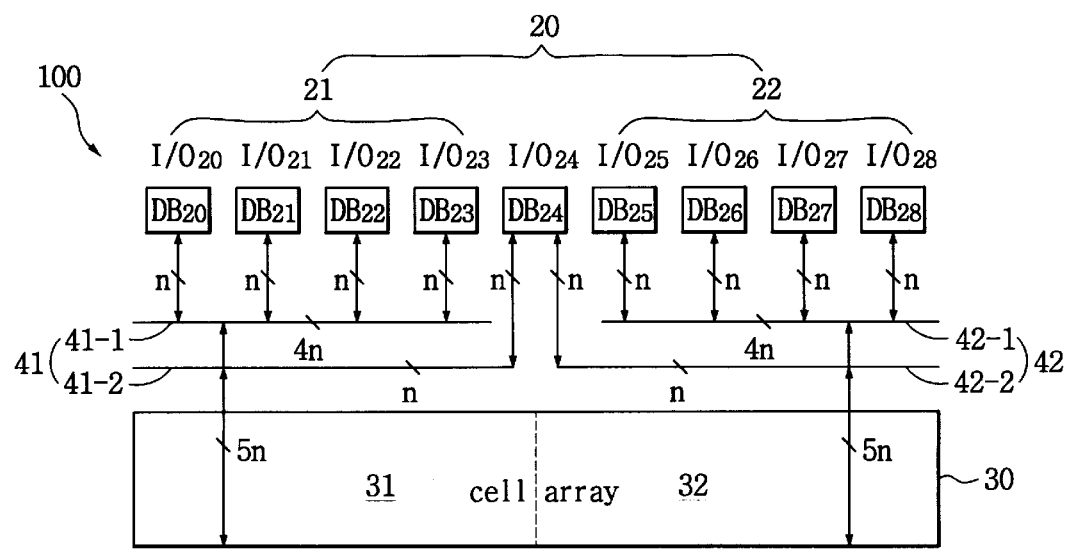
FIG. 2 is a diagram showing arrangement scheme of internal data lines and I/O pads in accordance with an embodiment of the present invention.

Referring to FIG. 2, a memory device 100 includes a data pad 20 having a plurality of I/O pads. In an embodiment of the present invention, the data pad 20 had nine I/O pads I/O20–I/O28 of odd number and is separated into two pad groups centering around a central I/O pad I/O24. A first pad group includes a plurality of I/O pads, for example four I/O pads I/O20 to I/O23 disposed in the left side of the central I/O pad I/O24 and a second pad group includes a plurality of I/O pads, for example four I/O pads I/O25 to I/O28 disposed in the right side of the central I/O pad I/O24. The first pad group has the same I/O pads as the second pad group.

An internal data line is divided into two data line groups 41 and 42, a first line group 41 being connected to all I/O pads I/O20–I/O23 of the first pad group 21 and the central I/O pad I/O24 and the second pad group 42 being connected to all I/O pads I/O25–I/O28 of the second pad group 22 and the central I/O pad I/O24. The first data line groups 41 includes a plurality of first main data lines 41-1 being connected to all I/O pads I/O20–I/O23 of the first pad group 21 and a plurality of first sub data lines 41-2 connected to the central I/O pad I/O24 and the second data line groups 42 includes a plurality of second main data lines 42-1 being connected to all I/O pads I/O25–I/O25 of the second pad group and a plurality of second sub data lines 42-2 connected to the central I/O pad I/O24.

According to the embodiment, the first main data lines 41-1 of the first line group 41 are connected to all I/O pads I/O20–I/O23 of the first pad group 21 and the first sub data line 41-2 is connected to only the central I/O pad I/O24. The second main data lines 42-1 of the second line groups 42 are connected to all I/O pads I/O25 I/O28 of the second pad group 22 and the second sub data line 42-2 is connected to only the central I/O pad I/O24. That is, the first main data line 41-1 and the second data line 42-1 in the internal data line 40 do not share all the I/O pads I/O20–I/O28. The first main data lines 41-1 share only corresponding I/O pads I/O20–I/O23 of the first pad group 21 and the second main data lines share only corresponding I/O pads I/O24–I/O28 of the second pad group 22. However, the first and second sub data lines 41-2 and 42-2 of the first line group 41 and the second line group 42 share the central I/O pad I/O24.

As the internal data line 40 and the data pad 20 are divided into plural groups, a cell array 30 is also divided into a plurality of cell regions. That is, as the internal data line 40 and the data pad 20 are divided into two groups, the cell array 30 is divided into two cell regions 31 and 32, one region 31 being corresponding to the first pad group 21 and the first line group 41 and another region 32 being corresponding to the second pad group 22 and the second line group 42, thereby independently transferring data therebetween. A plurality of data buffers DB20–DB28 which correspond to the I/O pads I/O20–I/O28 respectively, are arranged between the data pad 20 and the cell array 30 to transfer data therebetween.

That is, the first cell region 31 of the memory cell array 30 receives/provides data to/from the I/o pads I/O20–I/O23 of the first pad group 21 and the central I/O pad I/O24 through the first main and sub data lines 41-1 and 41-2 and the second cell region 32 of the memory cell array 30 receives/provides data to/from the I/O pads I/O25–I/O28 of the second pad group 22 and the central I/O pad I/O24.

Figure 3:
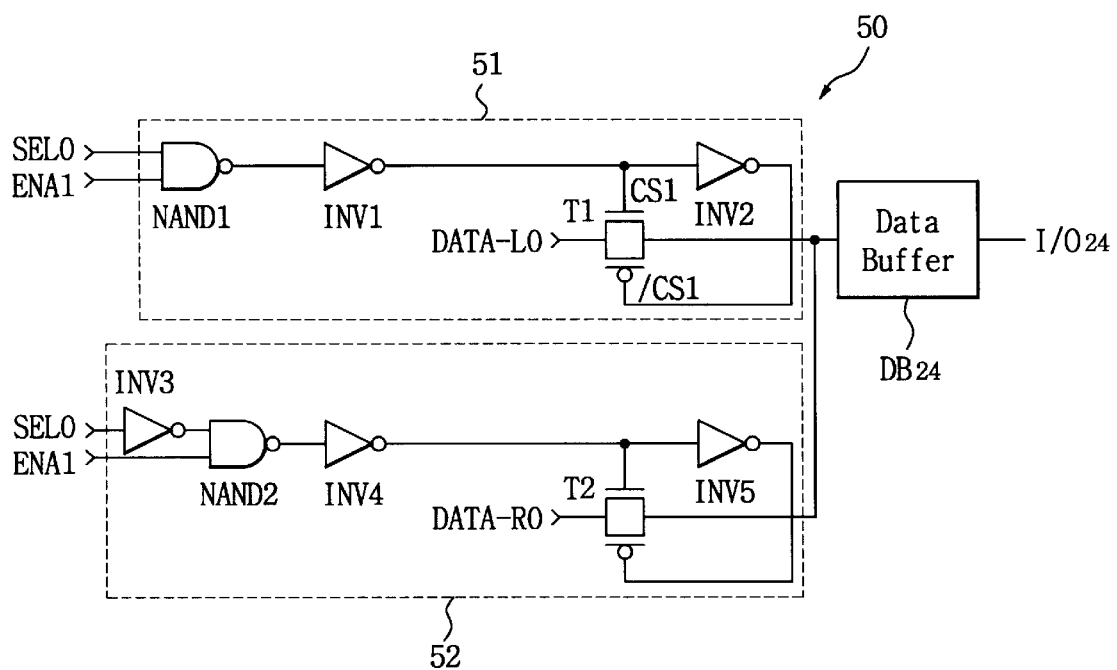
FIG. 3 is a circuit diagram of a data selection circuit for selecting data applied to a central I/O pad in the memory device of FIG. 2.

FIG. 3 shows a circuit diagram of the data selection circuit for selecting one of data transferred through the first and second sub data lines 41-1 and 41-2 connected to the central I/O pad I/O24. FIG. 3 shows an example of the data selection circuit for selecting data transferred to the central I/O pad I/O24 in case where the respective line groups includes one sub data line 41-2 or 42-2, that is in case of n=1 in FIG. 2.

The first sub data line 41-2 corresponds to the first pad group 21 and the first cell region 31 and the second sub data line 42-2 corresponds to the second pad group 22 and the second cell region 32.

Referring to FIG. 3, a data selection means 50 of the data selection circuit for selecting data transferred to the central I/O pad I/O24, includes a first selection means 51 for selecting data DATA-L0 from the first cell region 31 and transferring it to the central I/O pad I/O24 through the data buffer DB24 in accordance with a selection signal SEL0 for selecting one of the data DATA-L0 from the first cell region 31 or data DATA-R0 from the second cell region 32 and an enable signal ENAL for enabling the first and second sub data lines 41-2 and 42-2; and a second selection means 52 for selecting the data DATA-R0 from the second cell region 32 and transferring it to the central I/O pad I/O24 in accordance with the selection signal SEL0 and the enable signal ENAL.

The first selection means 51 includes a transfer means for transferring the data DATA-L0 from the first cell region 31 to the data buffer DB24 in accordance with a pair of control signals CS1 and /CS1 and a signal generation means for generating the pair of control signals CS1 and /CS1 in accordance with the selection signal SEL0 and the enable signal ENAL. The transfer means includes a transmission gate T1 which is driven by the pair of control signals CS1 and /CS1 to transfer the data DATA-L0 from the first cell region 31 to the data buffer DB24. The signal generation means includes a NAND gate NAND1 for carrying out NAND operation of the selection signal SEL0 and the enable signal ENA1, an inverting gate INV1 for inverting an output of the NAND gate NAND1 to generate the control signal CS1 and an inverting gate INV2 for inverting an output of the inverting gate INV1 to generate the inverted control signal CS1.

The second selection means 52 includes a transfer means for transferring the data DATA-R0 from the second cell region 32 to the data buffer DB24 in accordance with a pair of control signals CS2 and /CS2 and a signal generation means for generating the pair of control signals CS2 and /CS2 in accordance with the selection signal SEL0 and the enable signal ENA1. The transfer means includes a transmission gate T2 which is driven by the pair of control signals CS2 and /CS2 to transfer the data DATA-R0 from the second cell region 32 to the data buffer DB24. The signal generation means includes a NAND gate NAND2 for carrying out NAND operation of the selection signal SEL0 and the enable signal ENA1, an inverting gate INV3 for inverting an output of the NAND gate NAND2 to generate the control signal CS2 and an inverting gate INV4 for inverting an output of the inverting gate INV3 to generate the inverted control signal /CS2.

The operation of the data selection means 50 of the data selection circuit in the memory device of the present invention will be described in more detail.

The enable signal ENAL for enabling the first and second sub data lines 41-2 and 42-2 becomes active high state and the data selection means 50 selects one of the data DATA-L0 from the first cell region 31 through the first sub data line 41-2 or the data DATA-R0 from the second cell region 32 through the second sub data line 42-2 in accordance with the selection signal SEL0 and transfers the selected data to the I/O pad I/O24.

That is, if the selection signal is low state, the transmission gate T2 of the second selection means 52 turns on and the data DATA-R0 from the second cell region 32 is transferred to the I/O pad I/O24 through the data buffer DB24. On the other hand, if the selection signal is high state, the transmission gate T1 of the first selection means 51 turns on and the data DATA-L0 from the first cell region 31 is transferred to the I/O pad I/O24 through the data buffer DB24.

Figure 4:
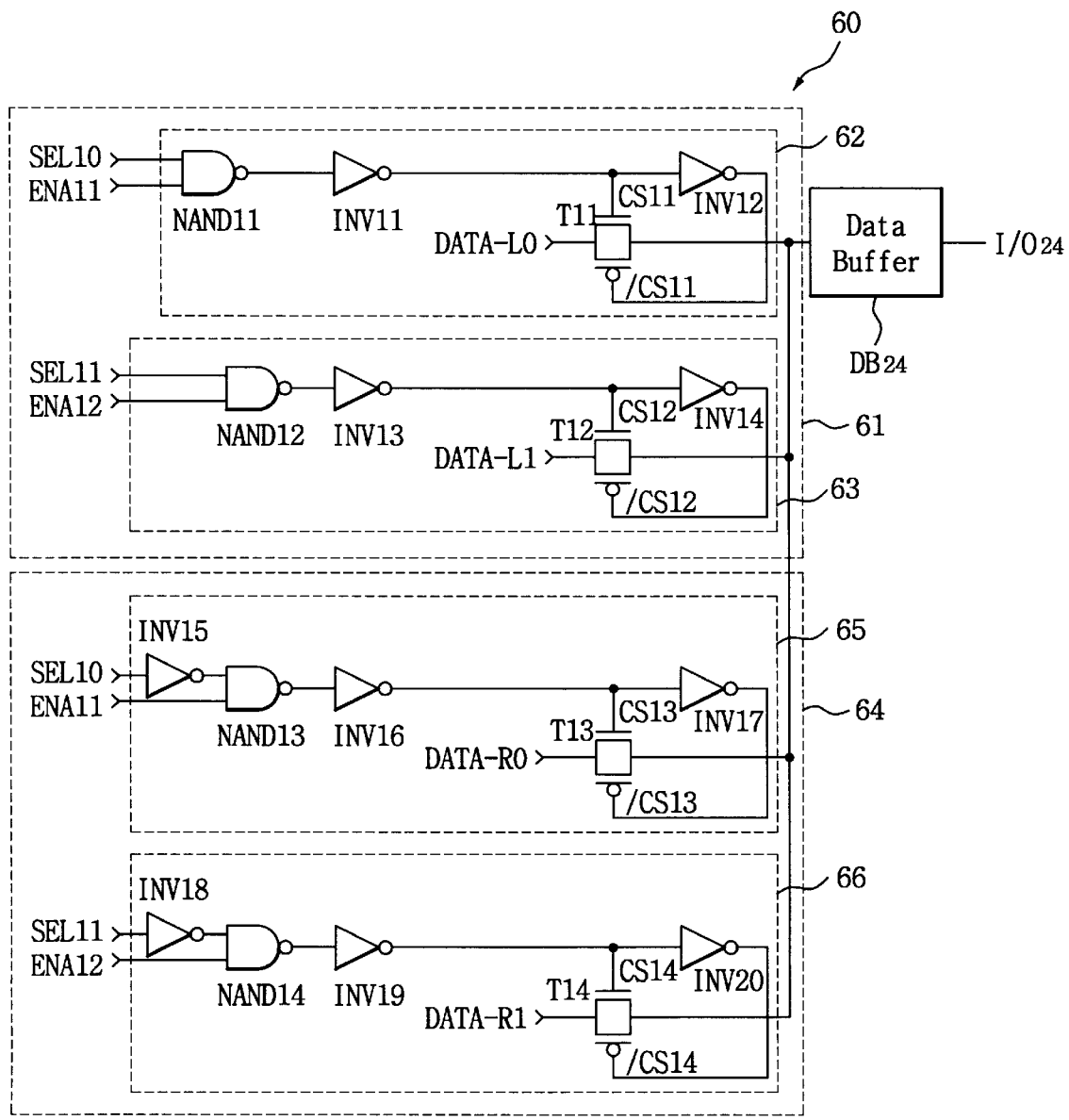
FIG. 4 is another circuit diagram of a data selection circuit for selecting data applied to a central I/O pad in the memory device of FIG. 2.

FIG. 4 is another circuit diagram of a data selection circuit of the present invention, which selects one of data transferred through sub data lines 41-2 and 42-2 to the central I/O pad I/O24, when the respective line groups is comprised of above two data lines. FIG. 4 is an example of a data selection circuit in case where the respective line groups is comprised of two data lines, that is in case of n=2 of FIG. 2. At this time, the sub data lines 41-2 of two in the first line group 41 respond to the first pad group 21 and the first cell region 31 and the sub data lines 42-2 of two in the second line group 42 respond to the second pad group 22 and the second cell region 32.

Referring to FIG. 4, a data selection means 60 of the data selection circuit in the present invention, includes a first selection means 61 for selecting data DATA-L0 and DATA-L1 from the first cell region 31 of the cell array 30 and transferring them to the central I/O pad I/O24 through the data buffer DB24 in accordance with the first and second selection signals SEL10 and SEL11 for selecting one of the data from the first cell region 31 or the data from the second cell region 32 and the first and second enable signals ENA11 and ENA12 for enabling the first two sub data lines 41-2 and the second two sub data lines 42-2, respectively and a second selection means 64 for selecting data DATA-R0 and DATA-R1 from the second cell region 32 of the cell array 30 and transferring them to the central I/O pad I/O24 through the data buffer DB24 in accordance with the first and second selection signal SEL11 and SEL11 and the first and second enable signals ENA11 and ENA12.

The first selection means 61 includes a lower data selection means 62 for selecting the lower data DATA-L0 of the data DATA-L0 and DATA-L1 from the first cell region 31 and transferring it to the central I/O pad I/O24 in accordance with the first selection signal SEL10 and the first enable signal ENA11 and an upper data selection means 63 for selecting the upper data DATA-L1 of the data DATA-L0 and DATA-L1 from the first cell regions 31 and transferring it to the central I/O pad I/O24 in accordance with the second selection signal SEL11 and the second enable signal ENA12.

The lower data selection means 62 of the first selection means 61 includes a transfer means which is comprised of a transmission gate T11 and is for transferring the lower data DATA-L0 from the first cell region 31 to the data buffer DB24 in accordance with a pair of control signals CS11 and /CS11 and a signal generation means which is comprised of logic gates NAND11, INV11 and INV12 and is for generating the pair of control signals CS11 and /CS11 to the transfer means.

The upper data selection means 63 of the first selection means 61 includes a transfer means which is comprised of a transmission gate T12 and is for transferring the upper data DATA-L1 from the first cell region 31 to the data buffer DB24 in accordance with a pair of control signals CS12 and /CS12 and a signal generation means which is comprised of logic gates NAND12, INV13 and INV14 and is for generating the pair of control signals CS12 and /CS12 to the transfer means.

The second selection means 64 includes a lower data selection means 65 for selecting the lower data DATA-R0 of the data DATA-R0 and DATA-R1 from the second cell region 32 and transferring it to the central I/O pad I/O24 in accordance with the first selection signal SEL11 and the first enable signal ENA11 and an upper data selection means 66 for selecting the upper data DATA-R1 of the data DATA-R0 and DATA-R1 from the second cell regions 32 and transferring it to the central I/O pad I/O24 in accordance with the second selection signal SEL11 and the second enable signal ENA12.

The lower data selection means 65 of the second selection means 64 includes a transfer means which is comprised of a transmission gate T13 and is for transferring the lower data DATA-R0 from the second cell region 32 to the data buffer DB24 in accordance with a pair of control signals CS13 and /CS13 and a signal generation means which is comprised of logic gates NAND13, INV16 and INV17 and is for generating the pair of control signals CS13 and /CS13 to the transfer means in accordance with the first selection signal SEL10 and the first enable signal ENA11.

The upper data selection means 66 of the second selection means 64 includes a transfer means which is comprised of a transmission gate T14 and is for transferring the upper data DATA-R1 from the second cell region 32 to the data buffer DB24 in accordance with a pair of control signals CS14 and /CS14 and a signal generation means which is comprised of logic gates NAND14, INV19 and INV20 and is for generating the pair of control signals CS14 and /CS14 to the transfer means in accordance with the second selection signal SEL11 and the second enable signal ENA12.

The operation of the data selection means 62 will be described in more detail as follows. Supposed that the first enable signal ENA11 is enabled, which is for enabling the respective data lines of the first and second two sub data lines so as transfer the lower data DATA-L0 and DATA-R0 from the first and second cell regions 31 and 32 and the second enable signal ENA12 is disabled, which is for enabling another respective data lines of the first and second two sub data lines 41-2 and 42-2 so as transfer the upper data DATA-L1 and DATA-R1 from the first and second cell regions 31 and 32.

Accordingly, as the second data selection signal SEL11 is low state, the transmission gate T11 of the lower data selection means 62 of the first selection means 61 turns on when the first data selection signal SEL11 is high state. The lower data DATA-L0 from the first cell region 31 is transferred to the I/O pad I/O24 through the data buffer DB24. When the first data selection signal is low state, the transmission gate T13 of the lower data selection means 65 of the second selection means 64 turns on so that the lower data DATA-R0 from the second cell region 32 is transferred to the I/O pad I/O24 through the data buffer DB24.

Next, supposed that the first enable signal ENA11 is disabled, which is for enabling the respective data lines of the first and second two sub data lines 41-2 and 42-2 so as to transfer the lower data DATA-L0 and DATA-R0 from the first and second cell regions 31 and 32 and the second enable signal ENA12 is enabled, which is for enabling another respective data lines of the first and second two sub data lines 41-2 and 42-2 so as to transfer the upper data DATA-L0 and DATA-R1 from the first and second cell regions 31 and 32.

Accordingly, as the first data selection signal SEL10 is low state, the transmission gate T12 of the upper data selection means 63 of the first selection means 61 when the second selection signal SEL11 is high state. The upper data DATA-L1 from the first cell region 31 is transferred to the I/O pad I/O24 through the data buffer DB24. When the second selection signal is low state, the transmission gate T14 of the upper data selection means of the second selection means 64 turns on so that the upper data DATA-R1 from the second cell region 32 is transferred to the I/O pad I/O24 through the data buffer DB24.

Figure 5:
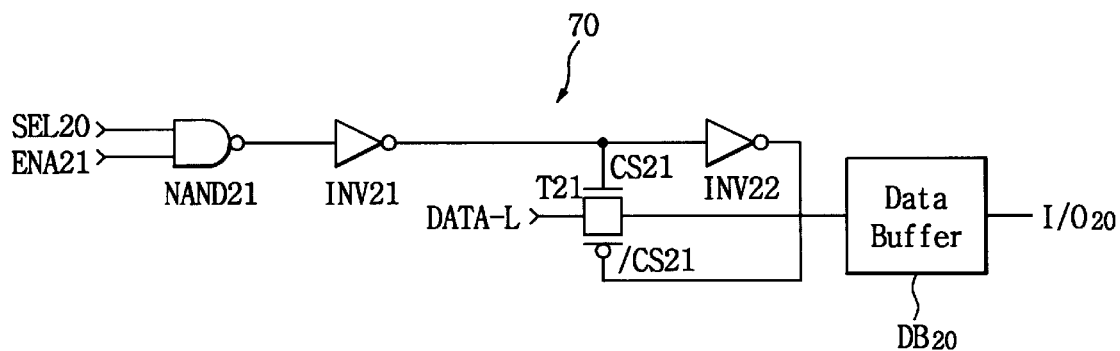
FIG. 5 is a circuit diagram of a data selection circuit for selecting data applied to a first pad group in the memory device of FIG. 2.

FIG. 5 shows a circuit diagram of the data selection circuit which transfers data between the first pad group 21 and the cell region 31 through the main data lines 41-1 of the internal data line 40 or data between the second pad group 22 and the cell region 32 through the main data lines 42-1 of the internal data line 40. FIG. 5 is an example of the data selection circuit for transferring data between the first pad group and the first cell region 31 when the respective line groups is comprised of one main data line, that is in case of n=1 of FIG. 2.

The data selection means 70 includes a transmission gate T21 for transferring the data DATA-L from the first cell region 31 through the main data line 41-1 in accordance with a pair of control signals CS21 and /CS21 and logic gates NAND21, INV21 and INV22 for generating a pair of the control signals CS21 and /CS21.

Although this invention discloses, in FIG. 5, only the example of the data selection means for transferring data between the first I/O pad I/O20 of the first pad group 21 and the first cell region 31 in case where the respective line groups is comprised of one main data line 41-1 (n=1 in FIG. 2), data selection means for transferring data between the first cell region 31 and the second through the fourth I/O pads I/O21–I/O23 of the first pad group 21 has the same construction as the data selection means 70. Furthermore, data selection means for transferring data between the second cell region 32 and the sixth through the ninth I/O pads I/O25 I/O28 of the second pad group 22 also has the same construction and operation as the data selection means 70 of FIG. 5.

Figure 6:
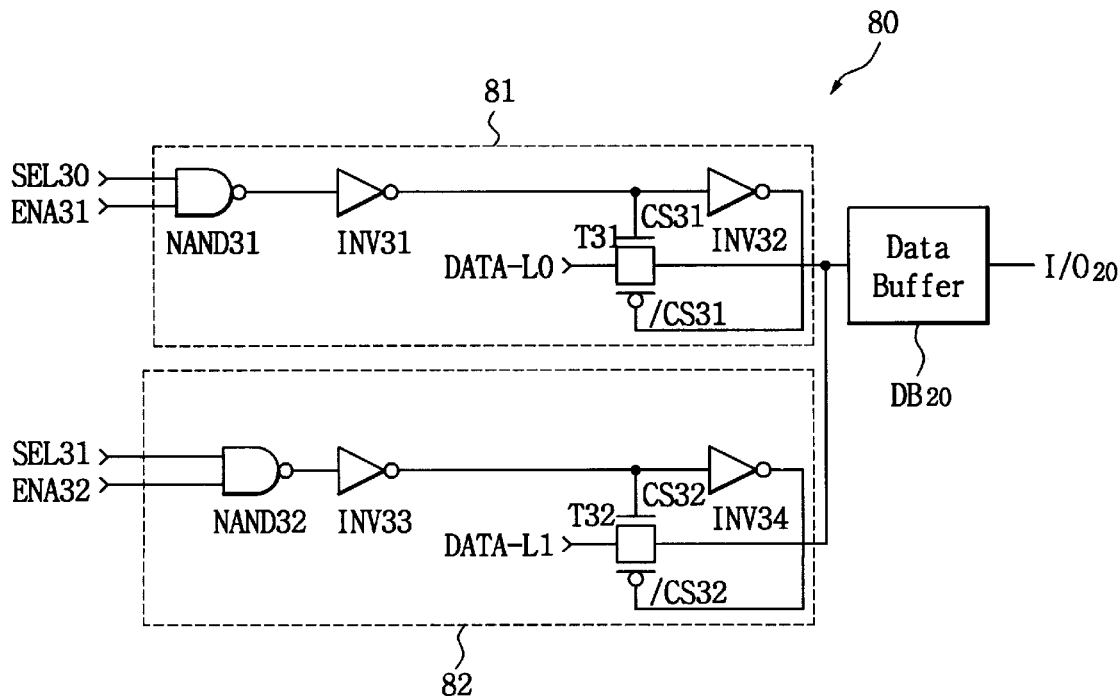
FIG. 6 is another circuit diagram of a data selection circuit for selecting data applied to a first pad group in the memory device of FIG. 2.

FIG. 6 shows a circuit diagram of the data selection circuit which transfers data between the first pad group 21 and the first cell region 31 through the main data lines 41-1 of the internal data line 40 or data between the second pad group 22 and the second cell region 32 through the main data lines 42-1 of the internal data line 40. FIG. 6 is an example of the data selection circuit for transferring data between the first pad group 21 and the first cell region 31 when the respective line groups is comprised of two main data lines, that is n=2 of FIG. 2.

The data selection means 80 includes a lower data selection means 81 for selecting the lower data DATA-L0 of the data DATA-L0 and DATA-L1 from the first cell region 31 and transferring it to the first I/O pad I/O20 through the data buffer DB20 in accordance with the first selection signal SEL30 of the first and second selection signals SEL30 and SEL31 and the first enable signal ENA31 of the first and second enable signals ENA31 and ENA32 and an upper data selection means 82 for selecting the upper data DATA-L1 of the data DATA-L0 and DATA-L1 from the first cell region 31 and transferring it to the first I/O pad I/O20 through the data buffer DB20 in accordance with the second selection signal SEL31 of the first and second selection signals SEL30 and SEL31 and the second enable signal ENA32 of the first and second enable signals ENA31 and ENA32.

The lower data selection means 81 includes a transfer means which is comprised of a transmission gate T31 and is for transferring the lower data DATA-L0 from the first cell region 31 to the data buffer DB20 in accordance with a pair of control signals CS31 and /CS31 and a signal generation means which is comprised of logic gates NAND31, INV31 and INV32 and is for generating the pair of control signals CS31 and /CS31 to the transfer means in accordance with the first selection signal SEL30 and the first enable signal ENA31.

The upper data selection means 82 includes a transfer means which is comprised of a transmission gate T32 and is for transferring the upper data DATA-L1 from the first cell region 31 to the data buffer DB20 in accordance with a pair of control signals CS32 and /CS32 and a signal generation means which is comprised of logic gates NAND32, INV33 and INV34 and is for generating the pair of control signals CS32 and /CS32 to the transfer means in accordance with the second selection signal SEL31 and the enable signal ENA32.

In case where the first enable signal ENA31 is enabled, which is for enabling one of two main data lines 41-1 and the first selection signal SEL30 is high state, the transmission gate T31 of the lower data selection means 81 so that the lower data DATA-L0 from the first cell region 31 is transferred to the I/O pad I/O20 through the data buffer DB20.

On the other hands, in case where the second enable signal ENA32 for enabling another line of two main data lines is enabled and the selection signal SEL31 for selecting the upper data DATA-L1 is high state, the transmission gate T32 of the upper data selection means 82 turns on so that the upper data DATA-L1 is transferred to the I/O pad I/O20 through the data buffer DB20.

Although this invention discloses, in FIG. 6, only the example of the data selection means for transferring data between the first I/O pad (I/O20) of the first pad group 21 and the first cell region 31 in case where the respective line groups is comprised of two main data line 41-1 (n=2 in FIG. 2), data selection means for transferring data between the first cell region 31 and the second through the fourth I/O pads I/O21–I/O23 of the first pad group 21 has the same construction as the data selection means 80. Furthermore, data selection means for transferring data between the second cell region 32 and the sixth through the ninth I/O pads (I/O25–I/O28) also has the same construction and operation as the data selection means 80 of FIG. 6.

As above described, although the preferred embodiment of the present invention illustrates the memory device having I/O pads of odd number, it may be applicable to a memory device having I/O pads of even number. At this time, the central I/O pad is not exist and the data pad 40 is divided into the first and second pad groups having the identical pad numbers. Furthermore, although the preferred embodiment illustrates the internal data line which is divided into two line groups, it may be divided into multiple line groups of two.

The present invention divides the internal data line and data pad centering around the central I/O pad to transfer data from the cell regions to the I/O pads, thereby reducing skew between the central I/O pad and the peripheral I/O pad due to line delay of the internal data line.

The I/O pad connection method dividing the data pad having I/O pads of even number illustrated in the preferred embodiment is identical with the I/O pad connection method diving the data pads I/O pads of odd number and the operation thereof will be omitted herein. At this time, in case of I/O pads of even number, the internal data line needs only the main data lines.

According to the present invention, the I/O pad connection method divides the internal data line into plural line groups and groups the data pad into plural pad groups so as to transfer data from the cell array to the I/O pads so that it can be reduce skew due to delay of the internal data line and dimension of chip with reduction of the length of the internal data line and improve input/output speed of data.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A memory device having a plurality of input/output (I/O) pads, comprising:
    a cell array;
    a data pad having the plurality of I/O pads for the cell array; and
    an internal data line,
    wherein the plurality I/O pads is an odd number, the I/O pads are grouped into pad groups centering around a central one of the I/O pads, the internal data line is divided into line groups centering around the central one of the I/O pads, and the line groups are connected only to the I/O pads of respective pad groups and the central one of the I/O pads.

2. The memory device as claimed in claim 1, wherein when the data pad is grouped into a first pad group and a second pad group centering around the central I/O pad and the internal data line is divided into a first line group and a second line group centering around the central I/O pad, the cell array is divided into a first cell region and a second cell region and data from the first cell region are transferred into the I/O pads of the first pad group and the central I/O pad through the first line group of the internal data line and data from the second cell region are transferred into the I/O pads of the second pad group and the central I/O pad through the second line group of the internal data line.

3. The memory device as claimed in claim 2, wherein the first line group of the internal data line includes:
    a plurality of first main data lines for transferring the data from the first cell region into the I/O pads of the first pad group; and
    a plurality of first sub data lines for transferring the data from the first cell region into the central I/O pad.

4. The memory device as claimed in claim 3, wherein the second line group of the internal data line includes:
    a plurality of second main data lines for transferring data from the second cell region into the I/O pads of the second pad group; and
    a plurality of second sub data lines for transferring the data from the second cell region into the central I/O pad.

5. The memory device as claimed in claim 4, further comprising a data selection circuit for selecting corresponding one of the data from the data lines and transferring a selected one to one I/O pad of the I/O pads, in accordance with a selection signal and an enable signal.

6. The memory device as claimed in claim 5, wherein the data selection circuit includes:
    a plurality of first data selection means for selecting one of the data transferred from the first cell region through the plurality of first main data lines of the first line group and transferring a selected one into corresponding I/O pad of the first pad group;
    a plurality of second data selection means for selecting one of the data transferred from the second cell region through the plurality of second main data lines of the second line group and transferring a selected one into corresponding I/O pad of the second pad group; and
    a plurality of third data selection means for selecting one of the data transferred from the first cell region through the plurality of first main data lines of the first line group or the data transferred from the second cell region through the plurality of second main data lines of the second line group and transferring a selected one into the central I/O pad.

7. The memory device as claimed in claim 6, wherein each of the plurality of first data selection means includes:
    a transfer means for transferring the selected data from the first cell region into corresponding I/O pad of the first pad group through the first main data line; and
    a signal generation means for generating a pair of control signals for controlling the transfer means in accordance with the selection signal for selecting corresponding one of the data from the first cell region and the enable signal for enabling the corresponding main data line of the plurality of first main data lines.

8. The memory device as claimed in claim 7, wherein the transfer means in each first data selection means includes a transmission gate driven by the pair of control signals generated from the signal generation means of each first data selection means.

9. The memory device as claimed in claim 7, wherein the signal generation means in each first data selection means includes:
    a NAND gate receiving the selection signal and the enable signal;
    a first inverting gate for inverting an output of the NAND gate to generate a first control signal of the control signal pair to the transfer means of each first data selection means; and
    a second inverting gate for inverting an output of the first inverting gate to generate a second control signal of the control signal pair to the transfer means of each first data selection means.

10. The memory device as claimed in claim 6, wherein each of the plurality of second data selection means includes:
    a transfer means for transferring the selected data from the second cell region into corresponding I/O pad of the second pad group through the second main data line; and
    a signal generation means for generating a pair of control signals for controlling the transfer means in accordance with the selection signal for selecting corresponding one of the data from the second cell region and the enable signal for enabling the corresponding main data line of the plurality of second main data lines.

11. The memory device as claimed in claim 10, wherein the transfer means in each second data selection means includes a transmission gate driven by the pair of control signals generated from the signal generation means of each second data selection means.

12. The memory device as claimed in claim 10, wherein the signal generation means in each second data selection means includes:
    a NAND gate receiving the selection signal and the enable signal;
    a first inverting gate for inverting an output of the NAND gate to generate a first control signal of the control signal pair to the transfer means of each second data selection means; and a second inverting gate for inverting an output of the first inverting gate to generate a second control signal of the control signal pair to the transfer means of each second data selection means.

13. The memory device as claimed in claim 6, wherein each of the plurality of third data selection means includes:

a transfer means for transferring the selected data of the data from the first cell region or the data from the second cell region into the central I/O pad through corresponding one of the first sub data line or the second sub data line; and a signal generation means for generating a pair of control signals for controlling the transfer means in accordance with the selection signal for selecting corresponding one of the data from the first cell region or the data from the second cell region and the enable signal for enabling the corresponding sub data line of the first sub data line or the second sub data line.

14. The memory device as claimed in claim 13, wherein the transfer means in each third data selection means includes a transmission gate driven by the pair of control signals generated from the signal generation means of each third data selection means.

15. The memory device as claimed in claim 13, wherein the signal generation means in each third data selection means includes:

a NAND gate receiving the selection signal and the enable signal;

a first inverting gate for inverting an output of the NAND gate to generate a first control signal of the control signal pair to the transfer means of each third data selection means; and a second inverting gate for inverting an output of the first inverting gate to generate a second control signal of the control signal pair to the transfer means of each third data selection means.

16. A memory device having a plurality of input/output (I/O) pads, comprising:

a cell array which is divided into a plurality of cell regions;

a data pad having the plurality of I/O pads, the pads being grouped into a plurality of pad groups in accordance with the cell regions;

an internal data line being divided into a plurality of line groups in accordance with the pad groups, each of line groups having a plurality of data lines being connected only to the I/O pads of corresponding one of pad groups; and a data selection circuit for selecting corresponding one of the data from the data lines and transferring a selected one to one I/O pad of the I/O pads, in accordance with a selection signal for selecting corresponding data from the cell regions and an enable signal for enabling corresponding one of the data lines.

17. A memory device having input/output (I/O) pads of odd number, comprising:

a cell array which is divided into a plurality of cell regions;

a data pad having the plurality of I/O pads, the pads being grouped into a plurality of pad groups in accordance with the cell regions;

an internal data line being divided into a plurality of line groups in accordance with the pad groups, each of line groups having a plurality of data lines being connected only to the I/O pads of corresponding one of pad groups; and a data selection circuit for selecting corresponding one of the data from the data lines and transferring a selected one to one I/O pad of the I/O pads, in accordance with a selection signal for selecting corresponding data from the cell regions and an enable signal for enabling corresponding one of the data lines;

wherein data pad is grouped into a first pad group and a second pad group centering around the central I/O pad and the internal data line is divided into a first line group and a second line group centering around the central I/O pad and the cell array is divided into a first cell region and a second cell region so that data from the first cell region are transferred into the I/O pads of the first pad group and the central I/O pad through the first line group of the internal data line and data from the second cell region are transferred into the I/O pads of the second pad group and the central I/O pad through the second line group of the internal data line;

wherein the first line group of the internal data line includes a plurality of first main data lines for transferring the data from the first cell region into the I/O pads of the first pad group; and a plurality of first sub data lines for transferring the data from the first cell region into the central I/O pad;

wherein the second line group of the internal data line includes a plurality of second main data lines for transferring data from the second cell region into the I/O pads of the second pad group; and a plurality of second sub data lines for transferring the data from the second cell region into the central I/O pad; and wherein the data selection circuit includes:

a plurality of first data selection means for selecting one of the data transferred from the first cell region through the plurality of first main data lines of the first line group and transferring a selected one into corresponding I/O pad of the first pad group;

a plurality of second data selection means for selecting one of the data transferred from the second cell region through the plurality of second main data lines of the second line group and transferring a selected one into corresponding I/O pad of the second pad group; and a plurality of third data selection means for selecting one of the data transferred from the first cell region through the plurality of first main data lines of the first line group or the data transferred from the second cell region through the plurality of second main data lines of the second line group and transferring a selected one into the central I/O pad.

* * * * *